(12) United States Patent
Hsiao

(10) Patent No.: US 11,019,721 B2
(45) Date of Patent: May 25, 2021

(54) MANUFACTURING METHOD OF FLEXIBLE ELECTRONIC DEVICE

(71) Applicant: HannsTouch Solution Incorporated, Tainan (TW)

(72) Inventor: Chien-Chih Hsiao, Tainan (TW)

(73) Assignee: HannsTouch Solution Incorporated, Tainan (TW)

( * ) Notice: Subject to any disclaimer, the term of this patent is extended or adjusted under 35 U.S.C. 154(b) by 30 days.

(21) Appl. No.: 16/562,370

(22) Filed: Sep. 5, 2019

(65) Prior Publication Data

US 2021/0076488 A1  Mar. 11, 2021

(51) Int. Cl.
| | |
|---|---|
| B29C 65/76 | (2006.01) |
| H01L 51/56 | (2006.01) |
| H05K 1/02 | (2006.01) |
| H05K 3/46 | (2006.01) |
| B32B 43/00 | (2006.01) |
| H01L 51/00 | (2006.01) |
| B29L 31/34 | (2006.01) |
| B32B 37/26 | (2006.01) |

(52) U.S. Cl.
CPC .......... *H05K 1/0271* (2013.01); *B29C 65/76* (2013.01); *B32B 43/006* (2013.01); *H01L 51/003* (2013.01); *H01L 51/0024* (2013.01); *H01L 51/0097* (2013.01); *H01L 51/56* (2013.01); *H05K 1/0281* (2013.01); *H05K 3/4673* (2013.01); *B29L 2031/3425* (2013.01); *B29L 2031/3475* (2013.01); *B32B 2037/268* (2013.01); *B32B 2457/08* (2013.01); *B32B 2457/206* (2013.01); *H01L 2227/326* (2013.01); *H01L 2251/5338* (2013.01); *H01L 2251/56* (2013.01); *H05K 2201/05* (2013.01)

(58) Field of Classification Search
CPC ............ B29C 65/76; B29L 2031/3425; B29L 2031/3475; B32B 2037/268; B32B 43/006; B32B 2457/08; B32B 2457/206; H01L 51/0024; H01L 51/003; H01L 51/0097; H01L 51/52; H01L 51/56; H01L 2227/326; H01L 2251/5338; H01L 2251/56; H05K 1/0271; H05K 1/0277; H05K 1/0281; H05K 1/0393; H05K 1/189; H05K 3/4673; H05K 2201/05
USPC ........................................................ 156/247
See application file for complete search history.

(56) References Cited

U.S. PATENT DOCUMENTS

| | | | |
|---|---|---|---|
| 10,332,775 B2 * | 6/2019 | Rusli | H01L 21/6833 |
| 10,950,821 B2 * | 3/2021 | Chu | B32B 38/10 |
| 2014/0141683 A1 * | 5/2014 | Zhou | H01L 51/003 |
| | | | 445/24 |
| 2018/0069163 A1 * | 3/2018 | Clark | H01L 33/44 |

* cited by examiner

*Primary Examiner* — Michael A Tolin
(74) *Attorney, Agent, or Firm* — Winston Hsu

(57) ABSTRACT

A flexible electronic device is disclosed and includes a first flexible substrate, a stress compensation adhesive layer, a second flexible substrate, and an element layer. The stress compensation adhesive layer is disposed on the first flexible substrate. The second flexible substrate is disposed on the stress compensation adhesive layer, in which the second flexible substrate is adhered to the first flexible substrate through stress compensation adhesive layer. The element layer is disposed on the second flexible substrate.

12 Claims, 10 Drawing Sheets

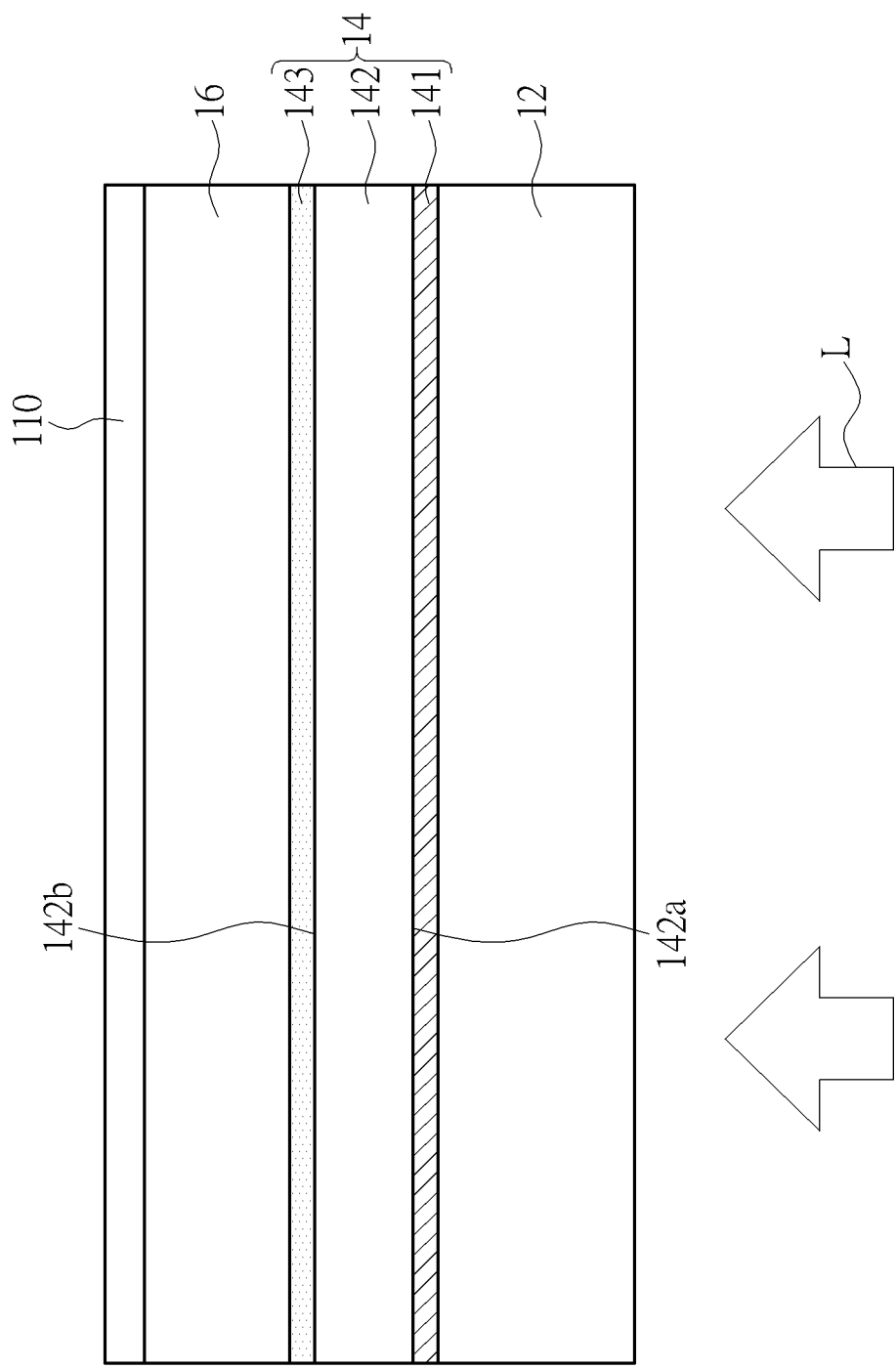

MANUFACTURING METHOD OF FLEXIBLE ELECTRONIC DEVICE

BACKGROUND OF THE INVENTION

1. Field of the Invention

The present invention relates to a flexible electronic device and a manufacturing method thereof, and more particularly, to a flexible electronic device and a manufacturing method that uses a multilayer structural compensation layer.

2. Description of the Prior Art

Since the flexible electronic device can be bent, folded or deformed, it has portability in a deformed state, and can be unfolded into a relatively large-sized electronic device in a non-deformed state, so that the flexible electronic device can have a variety of applications, such as mobile devices (e.g., smart phones, tablet computers, mobile personal computers, e-book readers, smart watches, etc.). In order to make the flexible electronic device have bendable characteristics, electronic elements of the flexible electronic device are fabricated on a flexible substrate. In traditional manufacturing method, the flexible substrate needs to be fixed on a carrier first, and then the electronic elements are manufactured on the flexible substrate. Thus, the relative position between film layers is not easy to shift when the electronic elements are manufactured, and the electronic elements can be manufactured. After the manufacture of the electronic elements is completed, the flexible substrate on which the electronic elements are formed is released from the carrier.

However, when the flexible substrate is removed from the carrier, the bonding between the flexible substrate and the carrier is often too high to difficultly separate them, thus causing disconnection or crack in the electronic elements during removal, and resulting in a drop in product yield. In addition, since there are stresses between the flexible substrate and the electronic elements formed thereon, the flexible substrate after being removed will curl, causing inconvenience for subsequent assembly. Although release film is currently used to help the flexible substrate and the carrier to be separated, the release film is prone to have locally increased adhesion after high-temperature semiconductor processes, so that the flexible substrate and the carrier are not easily separated, or the separating process causes damage to the electronic elements. Alternatively, in order to avoid the above situation, the peeling strength of the release film is reduced, so that the peeling strength of the release film is insufficient, and further displacement or separation occurs between the flexible substrate and the carrier in the processes of manufacturing the electronic elements.

SUMMARY OF THE INVENTION

According to an embodiment of the present invention, a flexible electronic device is disclosed and includes a first flexible substrate, a stress compensation adhesive layer, a second flexible substrate, and an element layer. The stress compensation adhesive layer is disposed on the first flexible substrate. The second flexible substrate is disposed on the stress compensation adhesive layer, in which the second flexible substrate is adhered to the first flexible substrate through stress compensation adhesive layer. The element layer is disposed on the second flexible substrate.

According to another embodiment of the present invention, a manufacturing method of a flexible electronic device is disclosed. First, a carrier is provided. Then, a structural compensation layer is adhered to the carrier, in which the structural compensation layer includes a light release layer, a first flexible substrate, and a stress compensation adhesive layer, the first flexible substrate is adhered to the carrier through the light release layer, and the stress compensation adhesive layer is located on a surface of the first flexible substrate opposite to the light release layer. Thereafter, a second flexible substrate is formed on the structural compensation layer, and then, an element layer is formed on the second flexible substrate. After that, the light release layer is irradiated with light to separate the carrier and the first flexible substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 9 and FIG. 10 schematically illustrate a manufacturing method of the flexible electronic device according to a third embodiment of the present invention.

DETAILED DESCRIPTION

Figure 1:
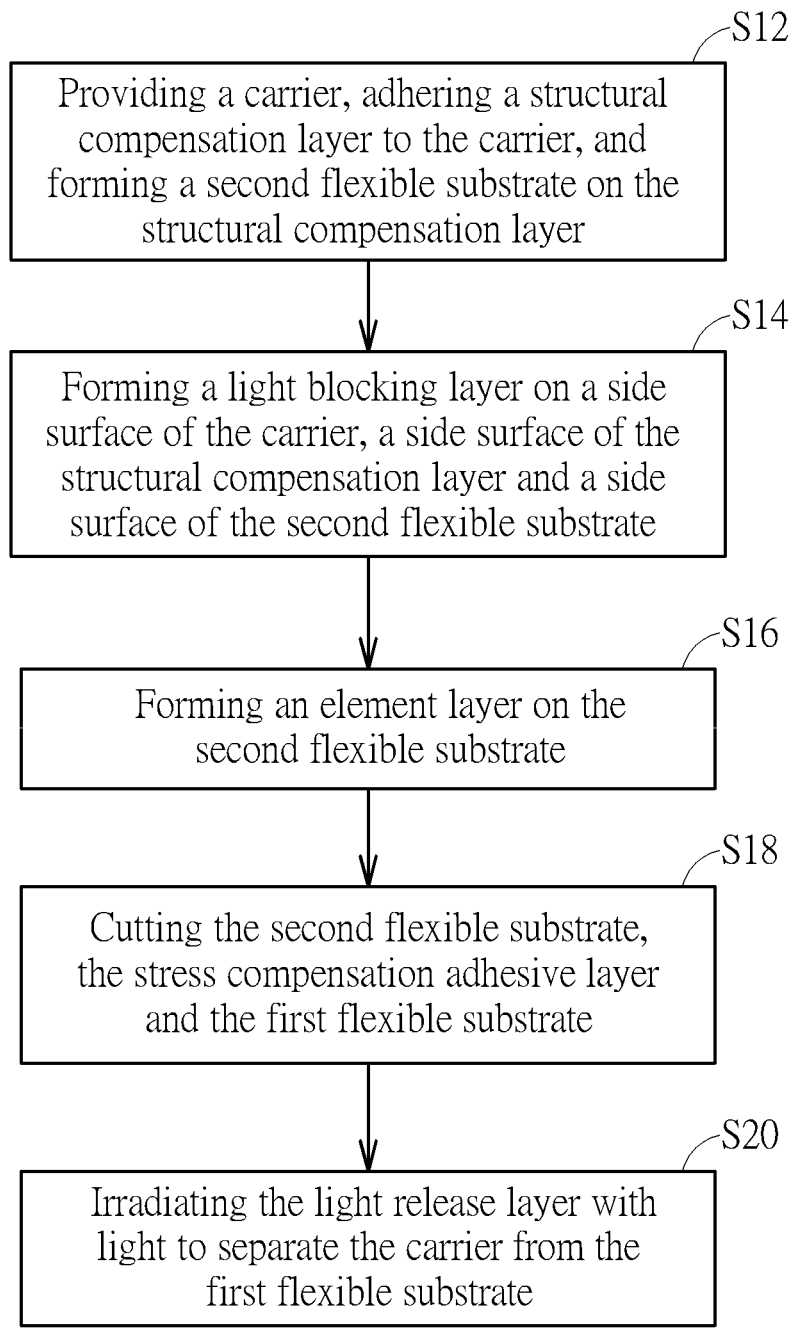
FIG. 1 is a flow chart of a manufacturing method of a flexible electronic device according to a first embodiment of the present invention.
Figure 2:
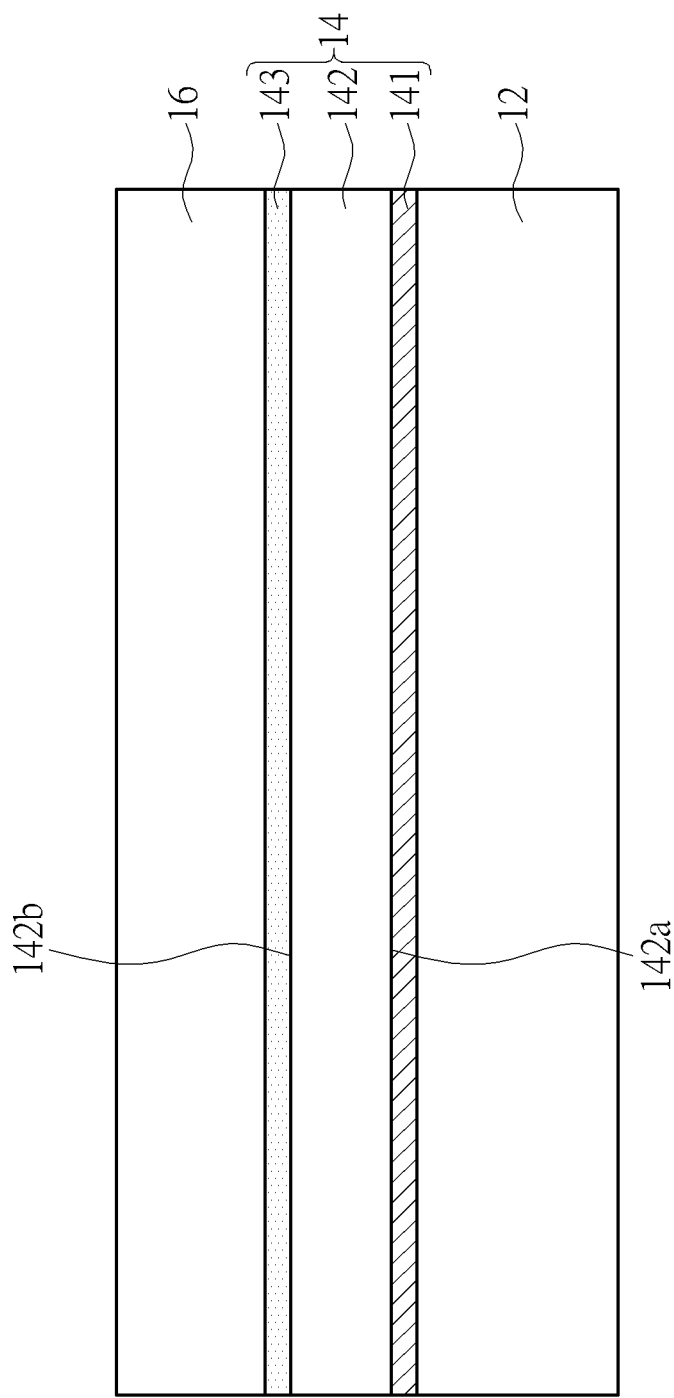
FIG. 2 through FIG. 6 schematically illustrates structures in different steps of the manufacturing method of the flexible electronic device according to the first embodiment of the present invention.
Figure 4:
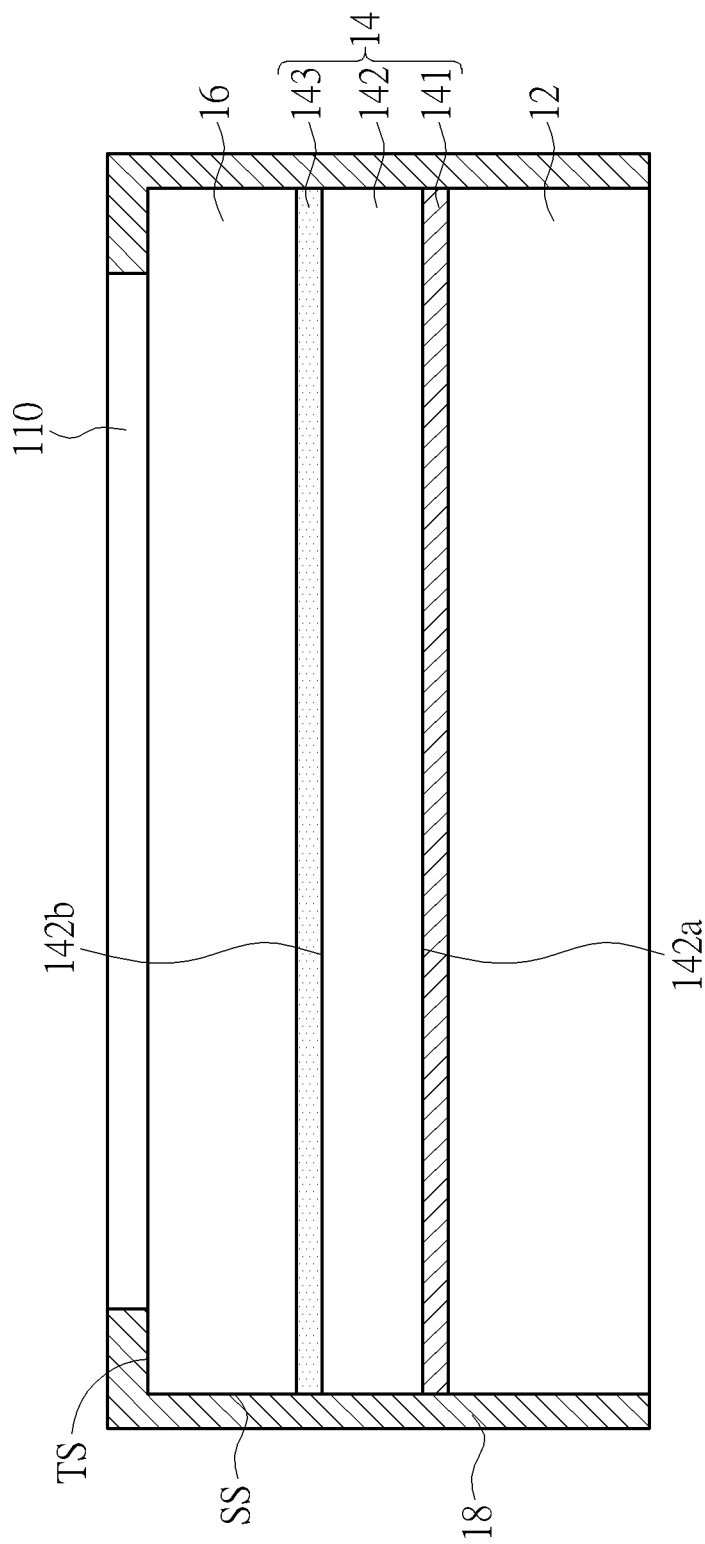
Figure 5:
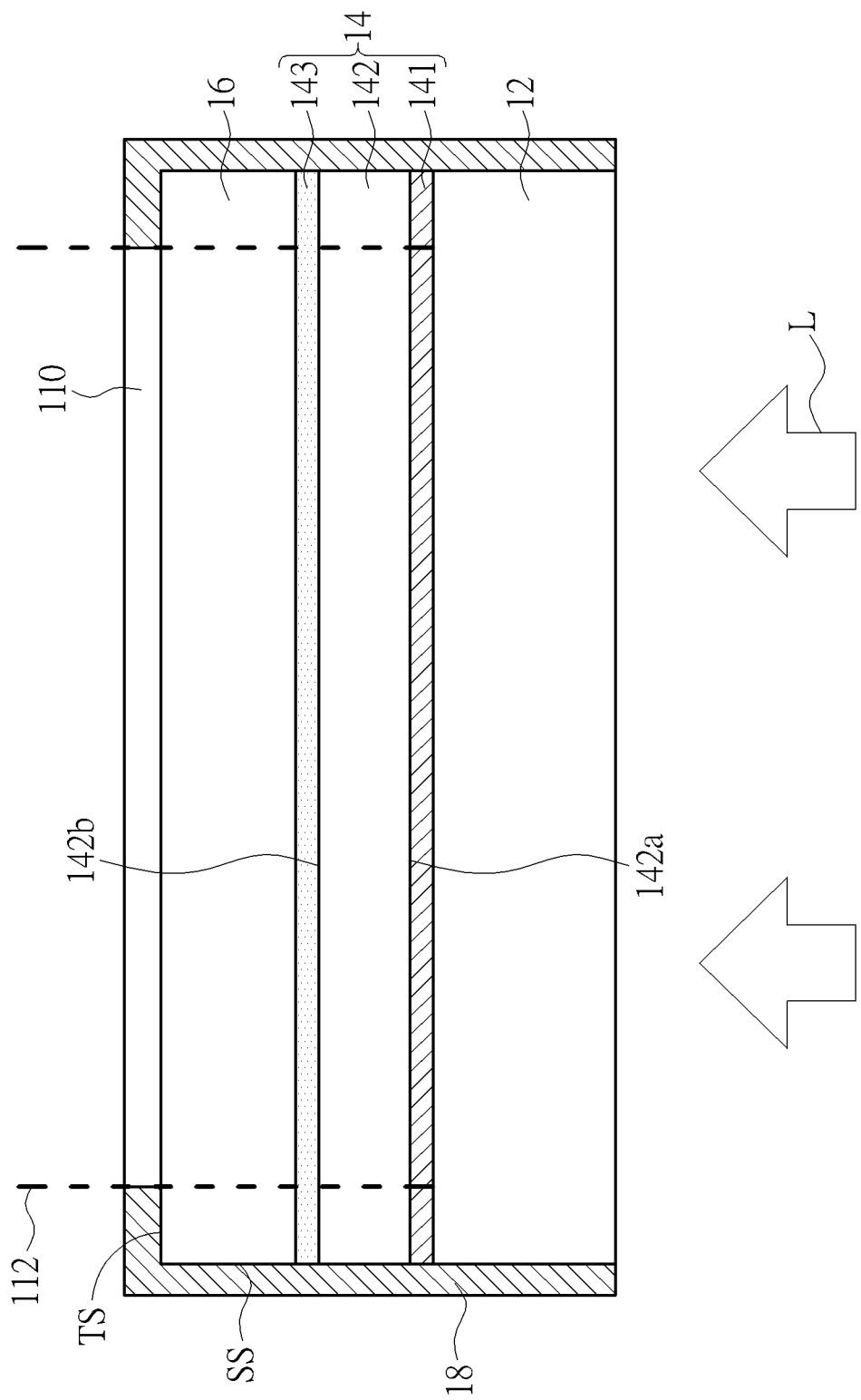
Figure 6:
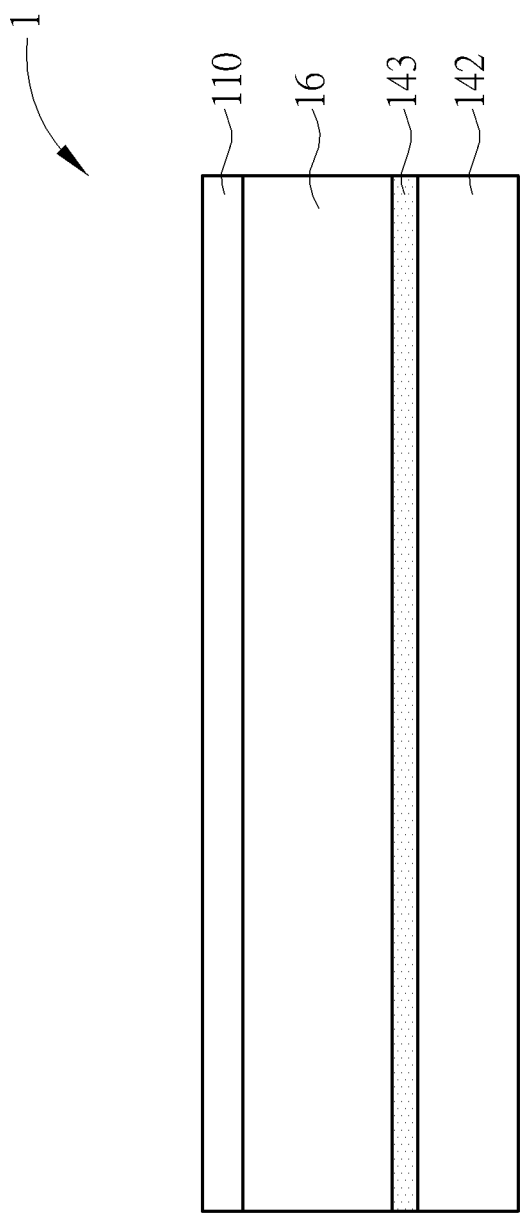
Figure 7:
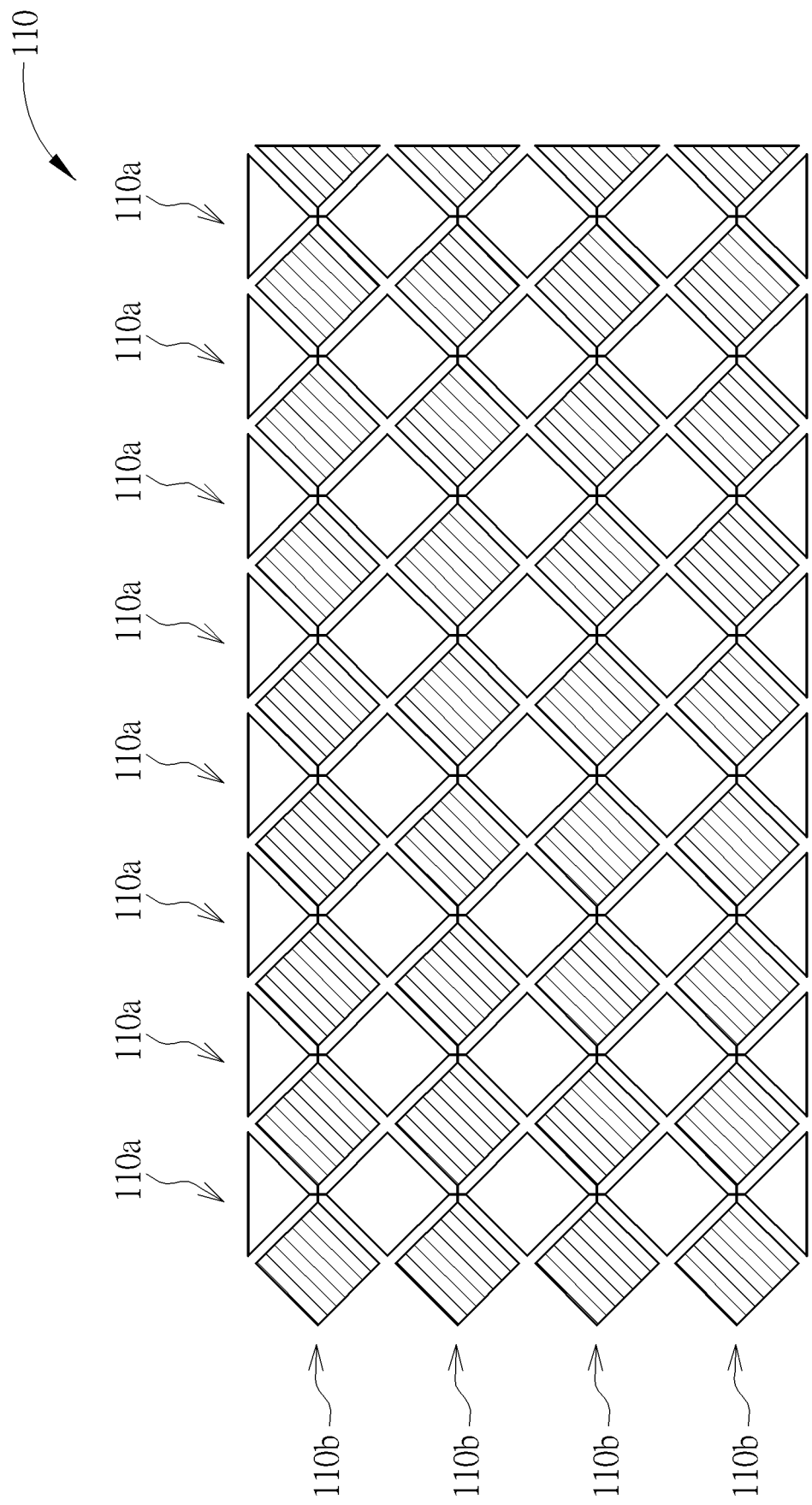
FIG. 7 schematically illustrates a top view of an element layer according to an embodiment of the present invention.

Please refer to FIG. 1 through FIG. 7. FIG. 1 is a flow chart of a manufacturing method of a flexible electronic device according to a first embodiment of the present invention. FIG. 2 through FIG. 6 schematically illustrates structures in different steps of the manufacturing method of the flexible electronic device according to the first embodiment of the present invention, in which FIG. 6 schematically illustrates a sectional view of the flexible electronic device according to an embodiment of the present invention, and FIG. 7 schematically illustrates a top view of an element layer according to an embodiment of the present invention. As shown in FIG. 1, the manufacturing method of the flexible electronic device provided in this embodiment includes steps S12 to S20 performed in sequence. Hereinafter, the manufacturing method of this embodiment will be described in detail with reference to FIG. 2 through FIG. 7. In step S12, as shown in FIG. 2, a carrier 12 is first provided. The carrier 12 may be, for example, a hard substrate for supporting film layers disposed or formed thereon. The hard substrate may include, for example, a glass substrate, a plastic substrate, a quartz substrate, a sapphire substrate, or other suitable substrates. Then, a structural compensation layer 14 is provided and adhered to the carrier 12. The structural compensation layer 14 includes a light release layer 141, a first flexible substrate 142 and a stress compensation adhesive layer 143, in which the light release layer 141 and the stress compensation adhesive layer 143 are respectively disposed on two opposite surfaces 142a and 142b of the first flexible substrate 142. For example, the light release layer 141 and the stress compensation adhesive layer 143 may be respectively formed on the two opposite surfaces 142a and 142b of the first flexible substrate 142 by coating. In the step of adhering the structural compensation layer 14, the structural compensation layer 14 is adhered and fixed on the carrier 12 in such a manner that the light release layer 141 faces the carrier 12, so that the light release layer 141 can adhere the first flexible substrate 142 to the carrier 12. As an example, the light release layer 141 may have a first peeling strength in a range from 20 g/cm to 300 g/cm, or from 100 g/cm to 300 g/cm before being irradiated with light, so the light release layer 141 may firmly adhere the first flexible substrate 142 to the carrier 12 to prevent the first flexible substrate 142 from being displaced or separated from the carrier 12 during subsequent processes. The light release layer 141 may include, for example, acrylic-based adhesive such as high temperature resistant acrylic type adhesive, silicone modified acrylic type adhesive, or epoxy modified acrylic type adhesive, but is not limited thereto. The first flexible substrate 142 may include, for example, polyimide (PI), polyethylene terephthalate (PET), polyethylene (PE), polypropylene (PP), or poly(methyl methacrylate) (PMMA) of which the high temperature resistant PI is preferred, but is not limited thereto.

Subsequently, a second flexible substrate 16 is formed on the structural compensation layer 14. The method for forming the second flexible substrate 16 may be performed by coating the second flexible substrate 16 on the stress compensation adhesive layer 143 or providing a thin-film second flexible substrate 16. Then, the second flexible substrate 16 is adhered to the first flexible substrate 142 through the stress compensation adhesive layer 143, but the present invention is not limited thereto. The second flexible substrate 16 may include flexible substrate material, such as transparent PI or translucent amber PI, but not limited thereto. The stress compensation adhesive layer 143 is not released while being irradiated with light, so during the following processes that include irradiation, the stress compensation adhesive layer 143 still can firmly fix the second flexible substrate 16 on the first flexible substrate 142. For example, the stress compensation adhesive layer 143 is not released while being irradiated with ultraviolet (e.g. light with wavelength in a range from 100 nm to 400 nm) or visible light (e.g. light with wavelength in a range from 400 nm to 700 nm). A material of the stress compensation adhesive layer 143 may include, for example, high temperature resistance silicone, siloxanes, epoxy resin, phenolic resins, or high temperature rubber, or a composite adhesive of a combination of at least two thereof, but not limited thereto.

Figure 3:
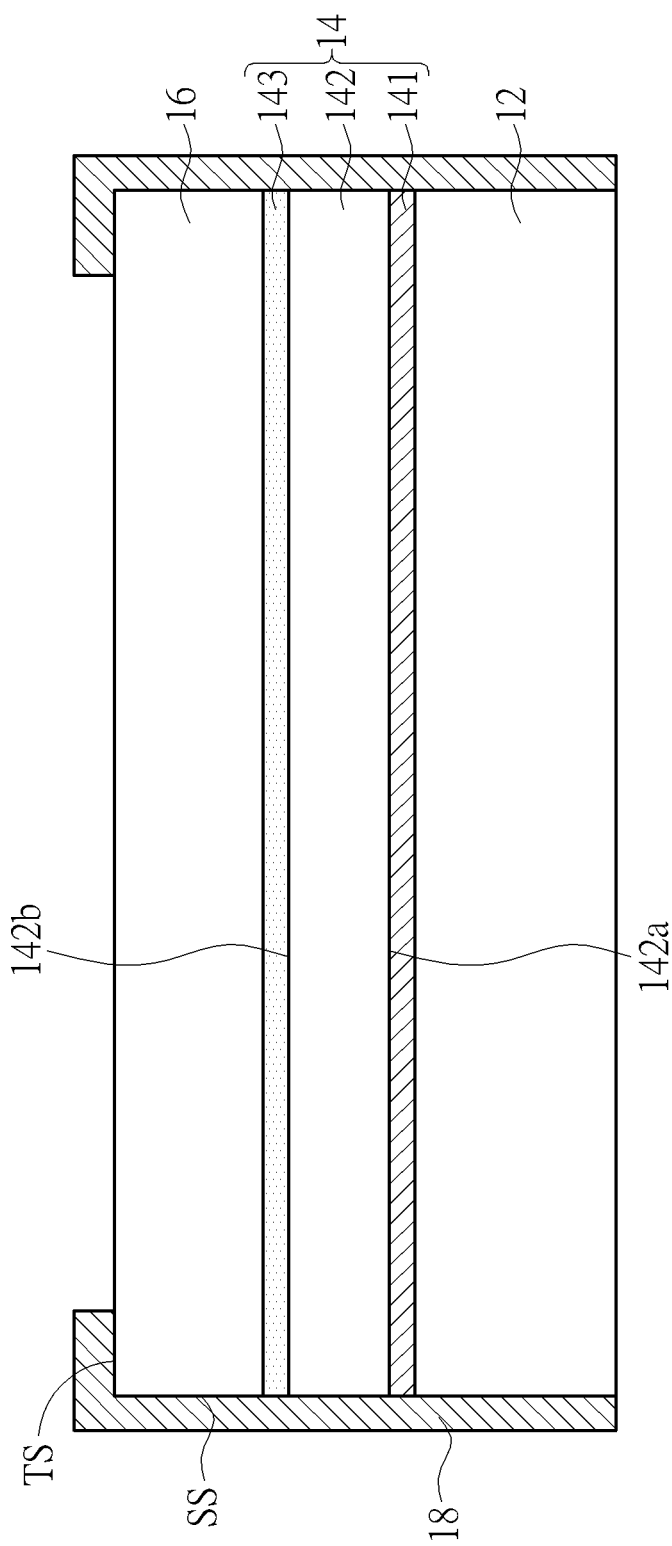

In step S14, as shown in FIG. 3, after forming the second flexible substrate 16, a light blocking layer 18 may be optionally formed on a side surface of the carrier 12, a side surface of the structural compensation layer 14 and a side surface SS of the second flexible substrate 16. In this embodiment, the step for forming the light blocking layer 18 may further include forming the light blocking layer 18 on a portion of the top surface TS of the second flexible substrate 16 close to the side surface SS, such that the light blocking layer 18 may shield irradiated light or plasma during the subsequent processes as much as possible, thereby avoiding the release of the light release layer 141. The light blocking layer 18 may be formed for example by spray coating, but not limited thereto. The light blocking layer 18 may include light blocking material, such as black photoresist material.

In step S16, as shown in FIG. 4, after forming the light blocking layer 18, an element layer 110 is formed on the second flexible substrate 16. According to the desired type of the flexible electronic device 1 to be formed, the element layer 110 may for example include array circuit layer of non-self-luminous display panel, array circuit, light emitting devices and passivation layer of self-luminous display panel, touch device and protection layer of touch panel, or other suitable panel devices, but not limited thereto. For this reason, the step of forming the element layer 110 may include at least one exposure process and/or at least one plasma process. The light used in the exposure process may be for example light with a wavelength of 436 nm, 405 nm or 365 nm, but not limited thereto. As an example, the element layer 110 may be a capacitive touch device that includes a plurality of vertical sensing electrode strings 110a and a plurality of horizontal sensing electrode strings 110b crossing the vertical sensing electrode strings 110a, as shown in FIG. 7.

In step S18, as shown in FIG. 5, after forming the element layer 110, the second flexible substrate 16, the stress compensation adhesive layer 143 and the first flexible substrate 142 are cut along a cutting line 112, so as to separate the element layer 110 from the light blocking layer 18.

As shown in FIG. 5, in step S20, after separating the element layer 110 from the light blocking layer 18, the light release layer 141 is irradiated with light L, so as to separate the carrier 12 from the first flexible substrate 142, thereby forming the flexible electronic device 1 of this embodiment, as shown in FIG. 6. Since the light release layer 141 may have different peeling strengths based on its material, by means of adjusting the difference between the material of the first flexible substrate 142 and the material of the carrier 12, the light release layer 141 can be separated from the first flexible substrate 142 or the carrier 12 after being irradiated with the light L. The carrier 12 formed of a glass substrate and the first flexible substrate 142 formed of PI are as an example. After the cutting, the light release layer 141 is still adhered to the carrier 12, and molecules in the light release layer 141 can be polymerized during being irradiated with light L, so the peeling strength of the light release layer 141 to the first flexible substrate 142 can be reduced to be a second peeling strength. Thus, the first flexible substrate 142 can be easily removed from the carrier 12. The second peeling strength of the light release layer 141 after being irradiated with the light L may be for example less than 3 g/cm, but not limited thereto. The light L for releasing may be for example ultraviolet. In some embodiments, the light release layer 141 may be irradiated with the light L at the same time as the cutting step.

It is noted that, by means of the characteristic of alterable peeling strength of the light release layer 141, the light release layer 141 can firmly adhere the second flexible substrate 16 to the carrier 12 during forming the element layer 110, such that the relative positions between the film layers and elements in the element layer 110 are not easily shifted, thereby maintaining the product yield of the formed element layer 110, and the adhesion of the light release layer 141 may be effectively reduced after being irradiated with light L, such that the removed flexible electronic device 1 is not easily affected by the separating step, thereby increasing the product yield of the flexible electronic device 1.

As shown in FIG. 6, the flexible electronic device 1 of this embodiment may include the first flexible substrate 142, the stress compensation adhesive layer 143, the second flexible substrate 16 and the element layer 110 sequentially stacked. The flexible electronic device 1 may be for example an array substrate, an organic light-emitting diode display device, touch panel, an electronic shelf labels (ESL) or an electronic backplane, but not limited thereto. It is noted that when the flexible electronic device 1 is applied to an end product used by consumer, the consumer still can see that the flexible electronic device 1 includes the first flexible substrate 142 and the stress compensation adhesive layer 143 of the structural compensation layer 14. In this embodiment, since stress exists between the element layer 110 and the second flexible substrate 16, the stress compensation adhesive layer 143 of this embodiment may further be designed to have stress compensation, such that the stress of the stress compensation adhesive layer 143 to the second flexible substrate 16 and the stress of the element layer 110 to the second flexible substrate 16 may be equivalent to each other and have opposite directions. Thus, when the first flexible substrate 142 is removed from the carrier 12, the curl of the second flexible substrate 16 resulted from unequal stresses on two sides of the second flexible substrate 16 can be avoided.

In addition, the stiffness of the first flexible substrate 142 may be optionally greater than the stiffness of the second flexible substrate 16, such that the flexible electronic device 1 can have the support of the first flexible substrate 142 while being removed from the carrier 12, thereby preventing circuits or elements in the element layer 110 from disconnection or damage. The stiffness of the first flexible substrate 142 is related to Young's modulus, thickness and uniaxial or biaxial stretching method of the first flexible substrate 142. For example, the Young's modulus of the first flexible substrate 142 may be for example in a range from 1000 Mpa to 6000 Mpa, the thickness of the first flexible substrate 142 may be for example in a range from 5 µm to 100 µm, and the stretching method preferably uses biaxial stretch, but not limited thereto.

The flexible electronic device of the present invention is not limited to the above embodiment. Further embodiments of the present invention are described below. To compare the embodiments conveniently and simplify the description, the same component would be labeled with the same symbol in the following. The following description will detail the dissimilarities among different embodiments and the identical features will not be redundantly described.

Figure 8:
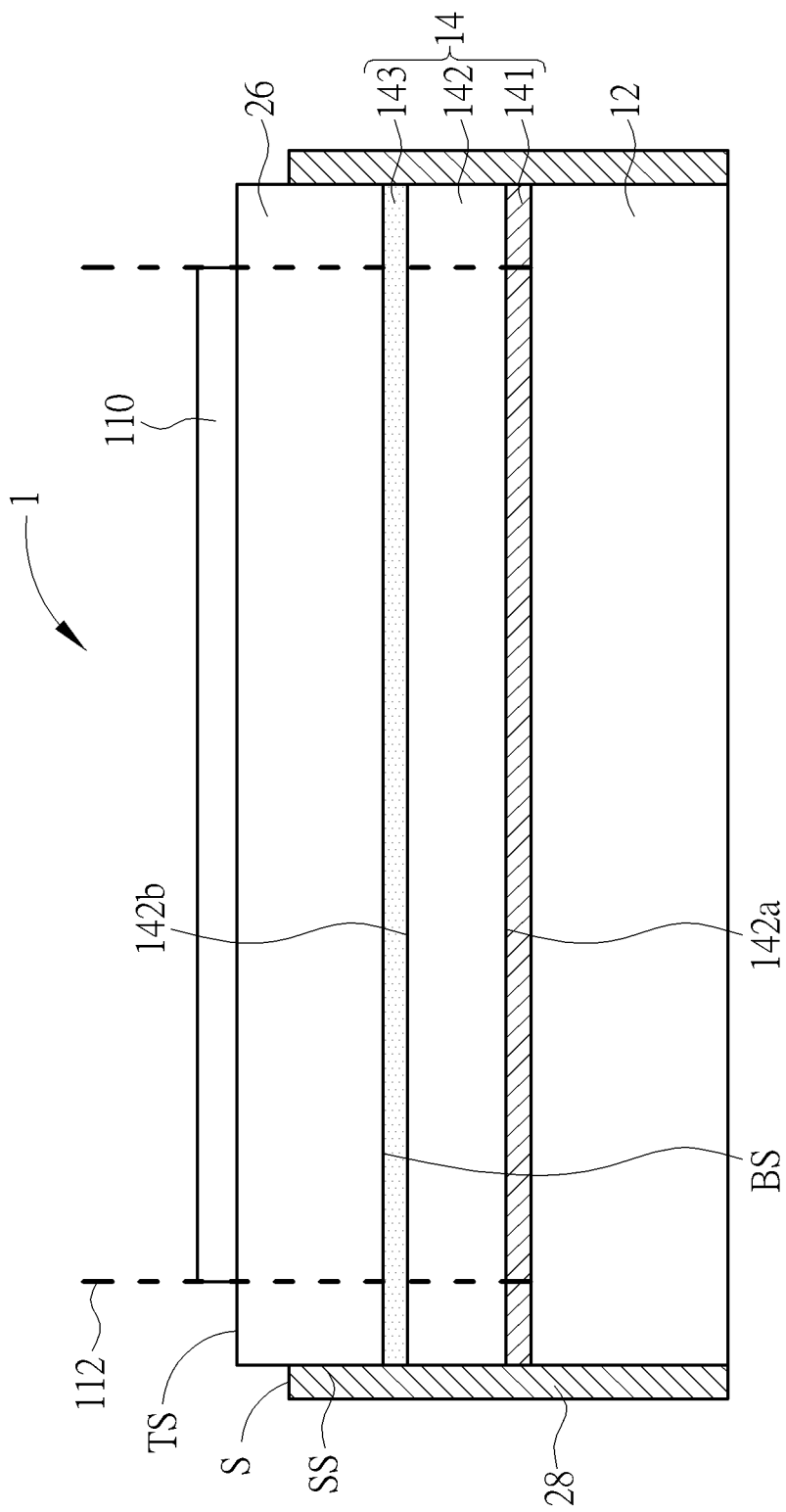
FIG. 8 schematically illustrates a manufacturing method of a flexible electronic device according to a second embodiment of the present invention.

Please refer to FIG. 8, which schematically illustrates a manufacturing method of a flexible electronic device according to a second embodiment of the present invention. The manufacturing method of the flexible electronic device 1 provided in this embodiment is different from the previous embodiment in that the second flexible substrate 26 of this embodiment may include yellow or amber PI, so the second flexible substrate 26 is capable of blocking ultraviolet and allows visible light to penetrate. In such situation, the light blocking layer 28 may cover a part of the side surface SS of the second flexible substrate 26 and may not extend onto the top surface TS of the second flexible substrate 26. In this embodiment, an edge S of the light blocking layer 28 close to the second flexible substrate 26 may be located between the top surface TS and the bottom surface BS of the second flexible substrate 26, be aligned to the top surface TS of the second flexible substrate 26, or be aligned to the bottom surface BS of the second flexible substrate 26. Since other steps of this embodiment are the same as that of the previous embodiment, they are not detailed redundantly. In some embodiments, since the top surface TS of the second flexible substrate 26 doesn't have the light blocking layer 28 formed thereon, the cutting step may optionally be not preformed, and the light release layer 141 is irradiated with light directly after forming the element layer 110, so as to separate the first flexible substrate 142 from the carrier 12.

Figure 9:
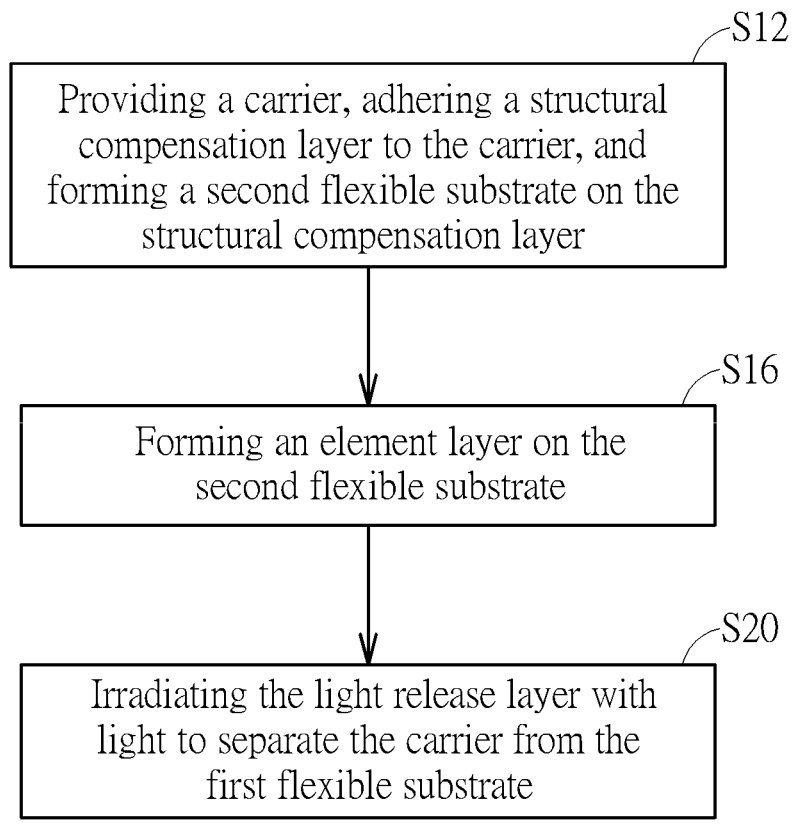

Please refer to FIG. 9 and FIG. 10, which schematically illustrate a manufacturing method of the flexible electronic device according to a third embodiment of the present invention. As shown in FIG. 9 and FIG. 10, the manufacturing method of the flexible electronic device provided in this embodiment includes step S12, step S16 and step S20 performed sequentially. The manufacturing method of this embodiment is different from the previous embodiment in that the wavelength of the light for releasing the light release layer is adjusted to be different from the wavelength of the exposing light used for forming the element layer 110 based on the material of the light release layer, such that the light release layer 141 is not released by the forming of the element layer 110. For this reason, the manufacturing method of this embodiment may ignore step S14 and step S18. Specifically, the material of the light release layer 141 provided in step S12 of this embodiment is different from the material of the light release layer of the previous embodiment, so the light blocking layer is not required to be formed after step S12. Also, step S16 can be performed directly after step S12, such that the element layer 110 is formed on the second flexible substrate 16 without the light blocking layer. For example, the wavelength of the light L used for releasing the light release layer 141 can be altered to be different from the light used in the exposure process for forming the element layer 110, such as the light with wavelength of 436 nm, 405 nm or 365 nm. Because no light blocking layer is formed, there is no need to perform the cutting step to separate the element layer 110 from the light blocking layer after forming the element layer 110. Instead, step S20 is directly performed to irradiate the light release layer 141 with light L having the wavelength different from the wavelength of the light used in the exposure process, so as to separate the carrier from the first flexible substrate. In some embodiments, after step S16 of forming the element layer 110, step S18 may be performed to remove undesired parts or separate plural flexible electronic devices from each other through cutting.

In summary, the multilayer structural compensation layer provided in the present invention includes the light release layer, so that relative positions between the film layers and elements in the element layer are not easily shifted during the step of forming the element layer, and the first flexible substrate can be easily separated from the carrier after forming the element layer, thereby increasing product yield of the flexible electronic device. Moreover, by means of the first flexible substrate and the stress compensation adhesive layer of the multilayer structural compensation layer, the stresses on two sides of the second flexible substrate can match with each other, so as to prevent the curl of the second flexible substrate. Accordingly, the wires or elements in the element layer can be avoided break or damage after the separating step.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a flexible electronic device, comprising:

providing a carrier;

adhering a structural compensation layer to the carrier, wherein the structural compensation layer comprises a light release layer, a first flexible substrate, and a stress compensation adhesive layer, the first flexible substrate is adhered to the carrier through the light release layer, and the stress compensation adhesive layer is located on a surface of the first flexible substrate opposite to the light release layer;

forming a second flexible substrate on the stress compensation adhesive layer of the structural compensation layer, wherein the stress compensation adhesive layer is between the first flexible substrate and the second flexible substrate;

forming an element layer on a top surface of the second flexible substrate opposite to the stress compensation adhesive layer, wherein the second flexible substrate is between the stress compensation adhesive layer and the element layer; and irradiating the light release layer with light to separate the carrier from the first flexible substrate.

2. The manufacturing method of the flexible electronic device according to claim 1, further comprising forming a light blocking layer on a side surface of the structural compensation layer and a side surface of the second flexible substrate between forming the second flexible substrate and forming the element layer.

3. The manufacturing method of the flexible electronic device according to claim 2, wherein the second flexible substrate is capable of blocking ultraviolet light.

4. The manufacturing method of the flexible electronic device according to claim 2, wherein forming the light blocking layer further comprises forming the light blocking layer on a portion of the top surface of the second flexible substrate close to the side surface of the second flexible substrate.

5. The manufacturing method of the flexible electronic device according to claim 1, wherein the light release layer has a first peeling strength in a range from 20 g/cm to 300 g/cm before irradiating the light release layer with the light.

6. The manufacturing method of the flexible electronic device according to claim 1, wherein the light release layer has a second peeling strength less than 3 g/cm after irradiating the light release layer with the light.

7. The manufacturing method of the flexible electronic device according to claim 1, wherein a material of the light release layer comprises acrylic-based adhesive.

8. The manufacturing method of the flexible electronic device according to claim 1, wherein the stress compensation adhesive layer is not released while the light release layer is irradiated with the light.

9. The manufacturing method of the flexible electronic device according to claim 1, wherein a stiffness of the second flexible substrate is greater than a stiffness of the first flexible substrate.

10. The manufacturing method of the flexible electronic device according to claim 1, wherein a wavelength of the light is in a range from 100 nm to 400 nm.

11. The manufacturing method of the flexible electronic device according to claim 1, wherein forming the element layer comprises at least one exposure process or at least one plasma process.

12. The manufacturing method of the flexible electronic device according to claim 1, wherein forming the element layer comprises using light having a wavelength different from that of the light which is used for irradiating the light release layer.

* * * * *